United States Patent
Buonodono (10) Patent No.: US 9,190,248 B2
(45) Date of Patent: Nov. 17, 2015

(54) DYNAMIC ELECTRODE PLASMA SYSTEM

(71) Applicant: Varian Semiconductor Equipment Associates, Inc., Gloucester, MA (US)

(72) Inventor: James P. Buonodono, Amesbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/020,793

(22) Filed: Sep. 7, 2013

(65) Prior Publication Data

US 2015/0069017 A1    Mar. 12, 2015

(51) Int. Cl.
| | |
|---|---|
| *C23F 1/00* | (2006.01) |
| *H01L 21/306* | (2006.01) |
| *H01J 37/32* | (2006.01) |

(52) U.S. Cl.
CPC ..... *H01J 37/32357* (2013.01); *H01J 37/32376* (2013.01); *H01J 37/32422* (2013.01); *H01J 37/32541* (2013.01); *H01J 37/32568* (2013.01)

(58) Field of Classification Search
CPC ............... H01J 37/32376; H01J 37/32422; H01J 37/32412
See application file for complete search history.

(56) References Cited

U.S. PATENT DOCUMENTS

| | | | |
|---|---|---|---|
| 7,523,009 B2 * | 4/2009 | Preikszas et al. | 702/107 |
| 2003/0082891 A1 | 5/2003 | Walther | |
| 2004/0007679 A1 * | 1/2004 | Viviani | 250/492.21 |
| 2005/0020070 A1 | 1/2005 | Ichiki et al. | |
| 2012/0104274 A1 * | 5/2012 | Hirayanagi et al. | 250/424 |
| 2012/0258601 A1 | 10/2012 | Holland et al. | |
| 2013/0052810 A1 | 2/2013 | Darby et al. | |
| 2013/0287963 A1 * | 10/2013 | Radovanov et al. | 427/523 |

OTHER PUBLICATIONS

International Search Report and Written Opinion Mailed Dec. 16, 2014 for PCT/US2014/054207 Filed Sep. 5, 2014.

\* cited by examiner

*Primary Examiner* — Maureen Passey
*Assistant Examiner* — Margaret D Klunk (57) ABSTRACT

A system for processing a substrate includes a plasma chamber to generate a plasma therein. The system also includes a process chamber to house the substrate, where the process chamber is adjacent the plasma chamber. The system also includes a rotatable extraction electrode disposed between the plasma chamber and substrate, where the rotatable extraction electrode is configured to extract an ion beam from the plasma, and configured to scan the ion beam over the substrate without movement of the substrate by rotation about an extraction electrode axis.

12 Claims, 9 Drawing Sheets

DYNAMIC ELECTRODE PLASMA SYSTEM

BACKGROUND

1. Field

Embodiments relate to the field of substrate processing using ions. More particularly, the present embodiments relate to a system and structure for providing an ion beam to a substrate.

2. Discussion of Related Art

Present day plasma based processing systems include apparatus in which a substrate is held stationary while immersed in a plasma that encompasses the substrate, as well as apparatus that employ scanning of a substrate in a process chamber adjacent to a plasma chamber or plasma source. The latter type of apparatus facilitates the use of relatively compact ion or plasma sources, since only a portion of a substrate need be exposed to ions from a plasma at a given time. For example, some configurations employ plasma chambers in which a rectangular extraction assembly is used to extract an ion beam having an elongated cross section.

To expose an entire substrate to ions from the plasma source, the substrate is scanned adjacent to the extraction assembly along a given direction. At any instance, a portion of the substrate defined by the size and shape of the extraction assembly is exposed to an ion beam having an elongated cross section, which may be as wide as the substrate being processed, wider or narrower. An advantage of this approach is that the exposed portion need only be as narrow as a few centimeters or even millimeters along the direction in which the substrate is scanned. In this manner, a plasma (ion) source may be employed that has dimensions smaller than the substrate being exposed, at least along one direction, which may allow large substrates to be treated without having to employ a plasma source that matches or exceeds the substrate size.

However, in such plasma systems, a process chamber may be significantly larger than the plasma source chamber in order to accommodate substrate scanning. This imposes a burden upon various components of a plasma processing system including process chamber housing components, scanning drives, pumps, and other components. As substrates scale to larger sizes, the concomitant scaling of some or all these components is contemplated. This places a further burden on plasma processing equipment manufacturers, as well as tool users, such as semiconductor manufacturers, solar cell manufacturers, and other device manufacturers that may employ such systems.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Embodiments of the present disclosure are directed to methods and systems for processing ions using plasma or other compact ion sources. In one embodiment a system for processing a substrate include a plasma chamber to generate a plasma therein. The system further includes a process chamber to house the substrate, where the process chamber is adjacent the plasma chamber. The system also includes a rotatable extraction electrode disposed between the plasma chamber and substrate, where the rotatable extraction electrode is configured to extract an ion beam from the plasma, and is further configured to scan the ion beam over the substrate without movement of the substrate by rotation about an extraction electrode axis.

In another embodiment, a method of processing a substrate includes generating a plasma in a plasma chamber, placing a substrate on a substrate holder such that a substrate surface faces the plasma chamber, and scanning an ion beam across the substrate by extracting the ion beam from the plasma chamber through a rotatable extraction electrode while rotating the rotatable extraction electrode.

DESCRIPTION OF EMBODIMENTS

The present embodiments will now be described more fully hereinafter with reference to the accompanying drawings, in which various embodiments are shown. The scope of the subject matter of the disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The present embodiments provide novel systems and apparatus to process substrates using ions. In various embodiments, processing systems include compact process chambers in which an entire substrate may be processed using an ion beam without translational movement of the substrate. This obviates the need for linear substrate drive mechanisms and larger process chambers to accommodate linear translation of a large substrate.

Figure 1:
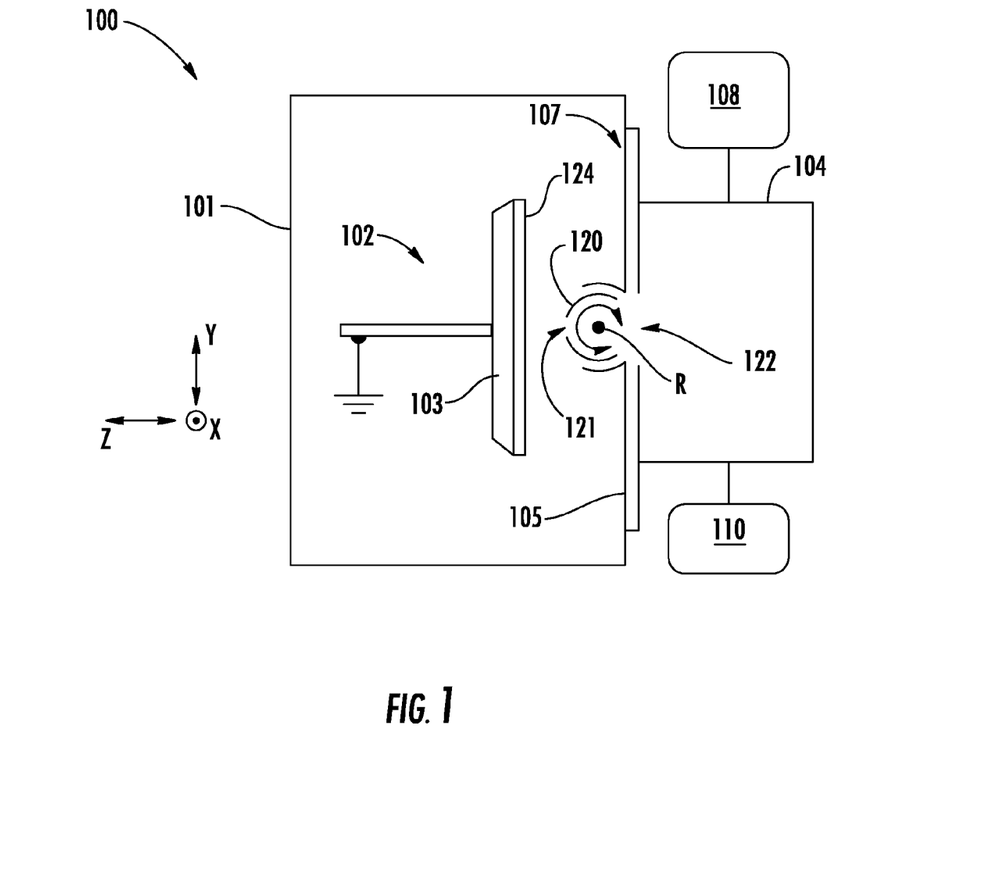
FIG. 1 is a schematic depiction of an exemplary processing system consistent with the present embodiments.

FIG. 1 depicts an exemplary processing system 100 that may be used to process (treat) a substrate using ions. The processing system 100 includes a process chamber 101 that houses a substrate stage 102. The substrate stage 102 includes a substrate platen 103 that supports a substrate 124. Adjacent a chamber wall 105 is disposed a plasma chamber (ion source chamber) 104 that is configured to generate ions. A gas source (not shown) may provide gaseous species to the plasma chamber 104 to form a plasma when power is applied to the plasma chamber 104. A plasma source (power source) for the plasma chamber 104 may, in various embodiments, be an in situ or remote, inductively coupled plasma source, capacitively coupled plasma source, helicon source, microwave source, or any other type of plasma source. Within the X-Y plane of the Cartesian coordinate system shown the plasma chamber 104 may have a square shape, a rectangular shape, a circular shape, or other shape. In some embodiments a power source 108 may be a radio frequency (RF) generator that generates a plasma by inductive or capacitive coupling. The embodiments are not limited in this context. In addition, the processing system 100 includes a bias source 110 whose operation is detailed below.

The processing system 100 and those other embodiments disclosed below may be employed to perform various types of ion processing of a substrate including ion implantation into a substrate, ion etching of a substrate, including etching of patterned features of a substrate; deposition of ions onto a substrate, and other processes. The embodiments are not limited in this context.

As further shown in FIG. 1, the processing system 100 includes a rotatable extraction electrode 120 that is disposed between the plasma chamber 104 and substrate 124. The rotatable extraction electrode 120 is configured to rotate about an extraction electrode axis R that extends along the X-direction in the Cartesian coordinate system shown. The rotatable extraction electrode 120 includes an aperture 121 that may be elongated in the X-direction. In this embodiment as well as others disclosed in the figures to follow, the extraction electrode axis R may be parallel to a chamber wall surface 107 of the chamber wall 105.

As detailed with respect to the FIGS. to follow, the rotatable extraction electrode 120 may extract ions from the plasma chamber 104 so as to direct an ion beam to the substrate 124 through the aperture 121. As the rotatable extraction electrode undergoes rotation, such an ion beam may be scanned across the substrate 124 without movement of the substrate, such as translational movement along the Y-direction. In various embodiments, the rotatable extraction electrode may have a curved structure, such as a cylindrical shape, and may be elongated along the X-direction as illustrated, for example, in FIG. 5A.

In the embodiment of FIG. 1 the rotatable extraction electrode 120 is disposed at least partially within the process chamber 101. In this arrangement an opening 122 is provided in the plasma chamber 104 so that gaseous species are communicated between the plasma chamber and rotatable extraction electrode. This may facilitate the formation of a plasma within a cavity region defined by the rotatable extraction electrode as discussed below.

Figure 2A:
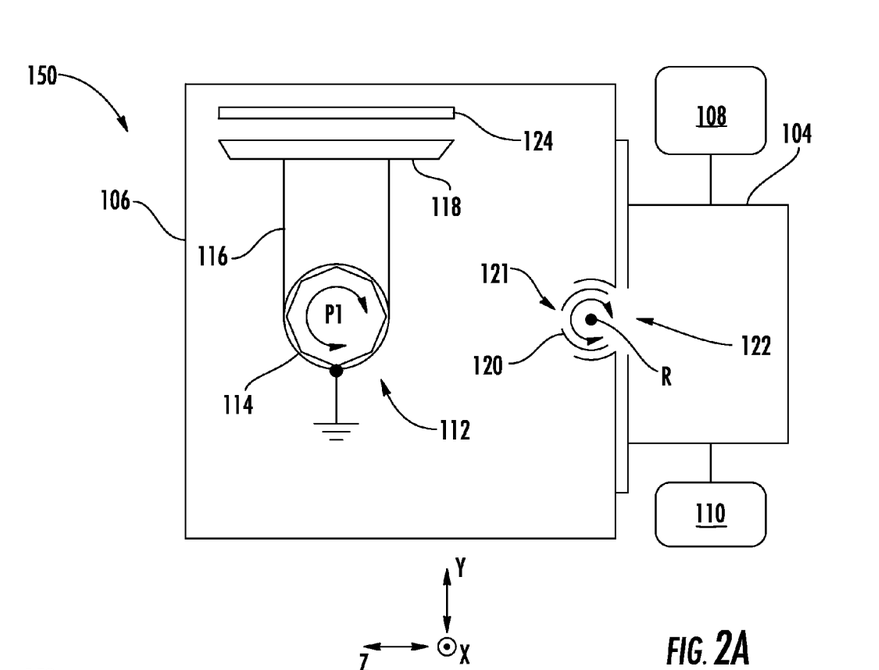
FIG. 2A is a schematic depiction of a first configuration of another exemplary processing system consistent with the present embodiments.
Figure 2B:
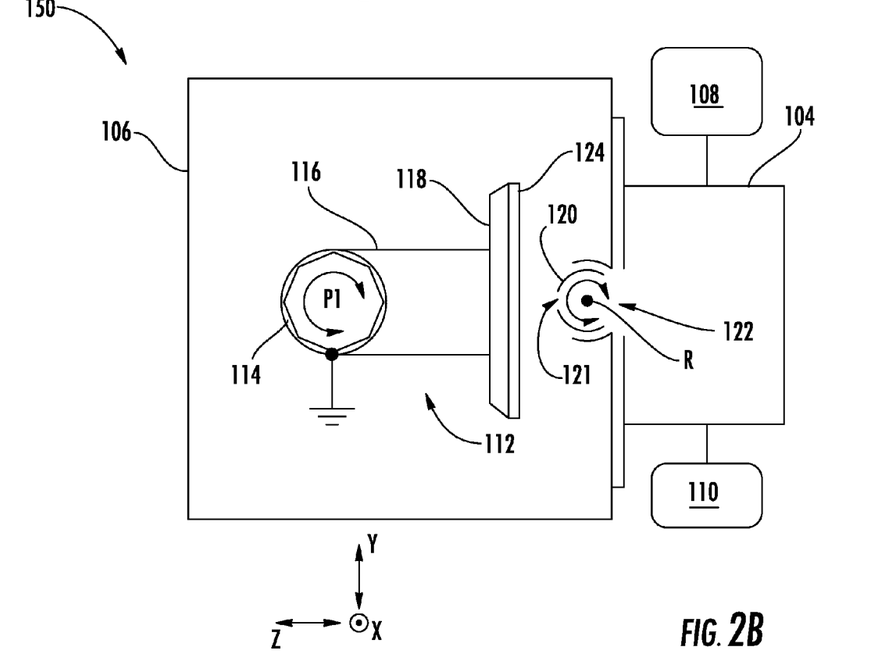
FIG. 2B is a schematic depiction of a second configuration of the processing system of FIG. 2A.

Turning now to FIG. 2A there is shown an embodiment of another processing system 150 having a rotatable extraction electrode 120. In this embodiment, a process chamber 106 is equipped with a rotatable substrate stage 112 that is configured to move a substrate 124 from a load position shown in FIG. 2A to a process position shown in FIG. 2B. In the embodiment shown, the rotatable substrate stage includes a substrate platen 118, and a radial member or radial portion 116 that is connected to a rotation member 114. The rotation member 114 is configured to rotate about an axis P1, which may be parallel to the extraction electrode axis R. As illustrated in FIG. 2B the process position of the substrate 124 constitutes a rotation of ninety degrees with respect to the load position. However other configurations are possible including 180 degree or 270 degree rotation between substrate load position and process position. In addition, configurations of a movable substrate stage that involve only translational motion or a combination of rotational and translational motion to shift the substrate platen between load and process position are possible. The embodiments are not limited in this context.

Moreover, in other configurations, a plasma chamber may be located on top of a process chamber such that a substrate in process position faces upwardly or a plasma chamber may be located underneath a process chamber such that a substrate in process position faces downwardly. The embodiments are not limited in this context. In the process position shown in FIGS. 2A and 2B the substrate 124 may be held to the substrate platen 118 in various ways. For example, an electrostatic chuck, vacuum chuck, or mechanical clamping component may be used to hold the substrate platen 118. The embodiments are not limited in this context.

A feature of the embodiment of FIGS. 2A and 2B is that the entire substrate 124 may be exposed to ions extracted from the plasma chamber 104 without having to perform any translational motion of the substrate 124. In other words, the substrate 124 may remain stationary or may only tilt or rotate about its axis during exposure to ions, This allows the size of process chamber 106 to be maintained at smaller dimensions that in systems that may scan a substrate 124 with respect to an aperture in order to expose the entire substrate to ions. For example, in some embodiments, the dimension of process chamber 106 along the Y-direction is less than double that of the substrate dimension along the Y-direction.

Figure 3:
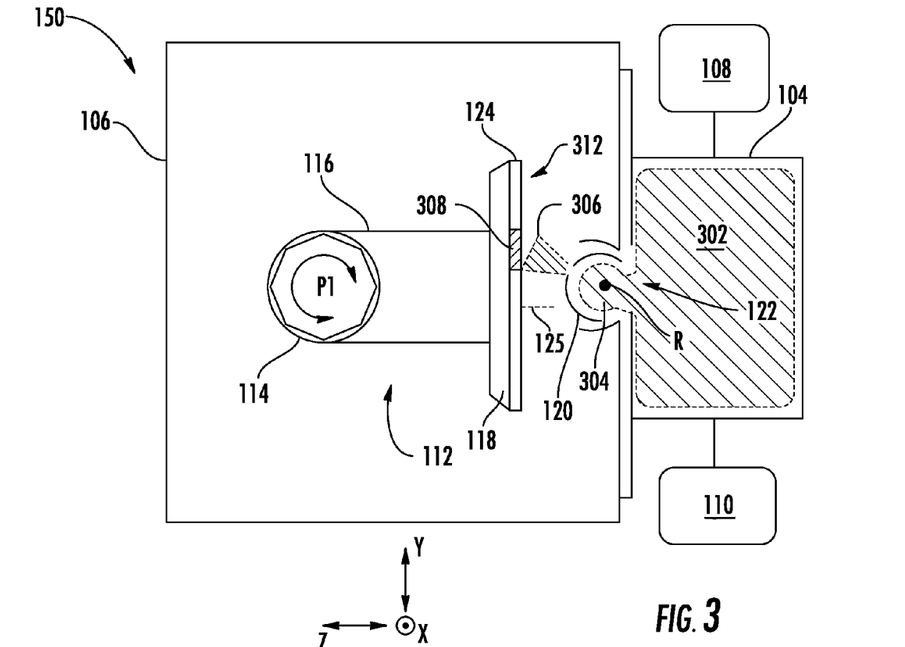
FIG. 3 depicts one instance of operation of the processing system of FIG. 2A.
Figure 4:
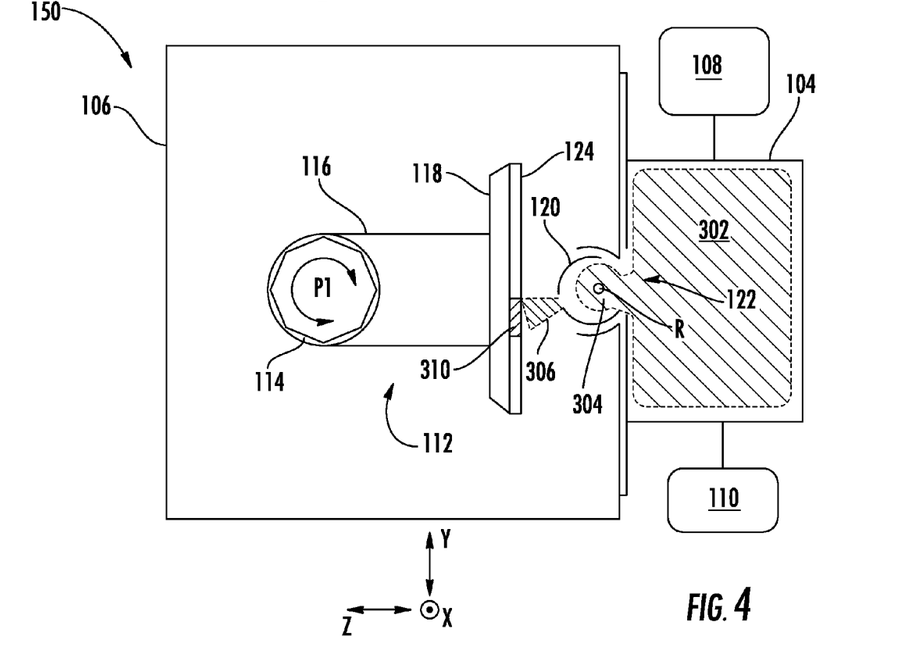
FIG. 4 depicts another instance of operation of the processing system of FIG. 2A.

Turning now to FIGS. 3 and 4, there is shown an example of processing a substrate 124 using the processing system 150. In this example, the power source 108 has generated a plasma 302 in the plasma chamber 104. The plasma may extend into a cavity region 304 defined by the rotatable extraction electrode 120, which presents a concave surface facing the plasma chamber 104. In some embodiments the rotatable extraction electrode 120 may be constructed from silicon carbide, graphite, or silicon oxide. The embodiments are not limited in this context.

In order to direct ions from the plasma 302 to the substrate 124, a bias may be applied between the substrate platen 118 and plasma chamber 104. In various embodiments, a continuous or pulsed bias having a desired voltage appropriate for a given process may be applied between the substrate platen 118 and plasma chamber 104. In the example shown in FIG. 3, a bias source 110 may apply a bias signal to the plasma chamber 104 while the substrate platen 118 is grounded. However, in other embodiments, a bias may be applied to the substrate platen 118, while the plasma chamber 104 is grounded. When a bias is applied between substrate platen 118 and plasma chamber 104, ions from plasma 302 may be extracted from the plasma 302 through the aperture 121 (see FIG. 2B) and accelerated to the substrate 124. As illustrated in FIG. 3, ions are directed as an ion beam 306 that impinges upon the substrate 124 at a portion of the substrate determined by the position of the aperture 121. This position, in turn, is determined by the rotational position of the aperture within the rotatable extraction electrode 120. In the instance depicted in FIG. 3, the aperture 121 is located at "10 o'clock" position, and the ion beam 306 strikes the substrate 124 in a region 308 upward of the center of the substrate 124. In the instance depicted in FIG. 4, the position of the aperture 121 is rotated counterclockwise with respect to the position shown in FIG. 3 to the "8 o'clock" position. Accordingly, the ion beam 306 strikes the substrate 124 in a region 310 downward of the center of the substrate 124. Thus, when a continuous rotation is applied to the rotatable extraction electrode 120, for example, between about "11 o'clock" and "7 o'clock" positions of the aperture 121, the ion beam 306 may be scanned continuously across the entire substrate 124. In various additional embodiments, the rotatable extraction electrode 120 may oscillate such that an ion beam is scanned back and forth across the substrate 124.

Figure 5A:
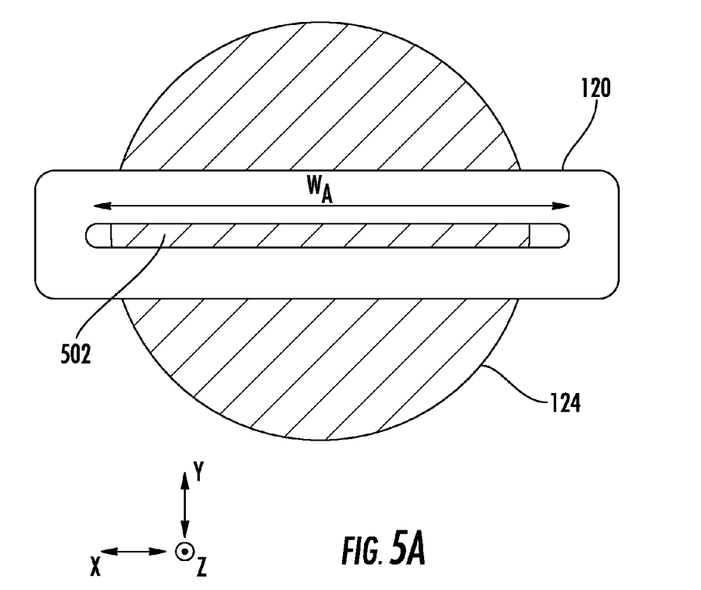
FIGS. 5A and 5B present details of geometry of scanning an ion beam over a substrate using a rotatable extraction aperture according to various embodiments.
Figure 5B:
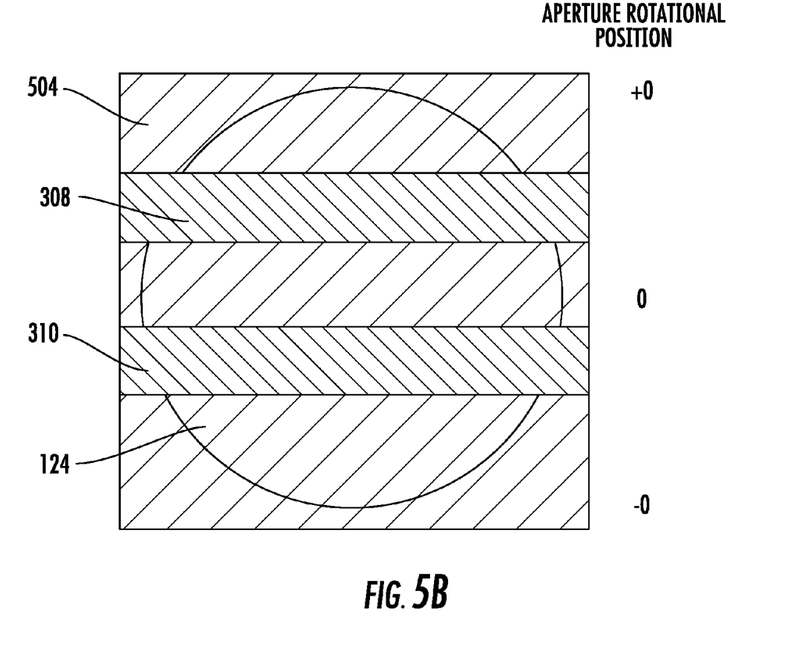

FIGS. 5A and 5B present further details of geometry of scanning an ion beam over a substrate using the example shown in FIGS. 3 and 4. FIG. 5A presents a view of the substrate 124 and rotatable extraction electrode 120 from the perspective of the plasma chamber 104. In this embodiment, the rotatable extraction electrode 120 is an elongated cylinder that presents an aperture 502 that is elongated along the X-direction. As illustrated, the aperture width $W_A$ is greater than the substrate width or diameter. This allows an ion beam that is extracted through the rotatable extraction electrode 120 to completely cover a substrate 124 along the X-direction when positioned as shown in FIG. 5A. In some embodiments, $W_A$ may range up to 300 mm or larger. The aperture height along the Y-direction may range from two millimeters to five centimeters in some embodiments.

Figure 5C:
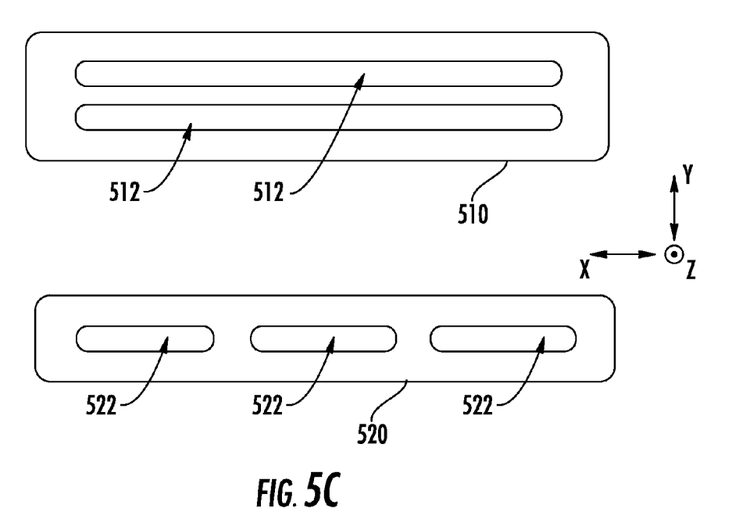
FIG. 5C depicts an exemplary extraction plate.

Multiple apertures may also be used, spaced either along the x-axis or y-axis. FIG. 5C depicts an exemplary extraction plate 510 having two elongated apertures 512 spaced along the Y-direction, and an extraction plate 520 having three apertures 522 spaced along the X-direction.

Turning now to FIG. 5B, there is shown the result of processing the substrate 124 by scanning an ion beam across the substrate 124 using the rotatable extraction electrode 120 as configured in FIG. 5A. The implant pattern 504 represents ion dose projected in the X-Y plane that is provided by the rotatable extraction electrode 120 after the rotatable extraction electrode 120 is rotated between angular positions that are shown between +θ and −θ where zero degrees represents the position illustrated in FIG. 5A (corresponding to "9 o'clock" position in FIG. 2B). The position of regions 308 and 310 is also shown for reference. As illustrated, the entire substrate 124 is exposed to ions by the rotation of rotatable extraction electrode 120.

Referring again to FIGS. 3 and 4, in the embodiment of a processing system 150, when the substrate 124 is in processing position, a substrate surface 312 that is exposed to the ion beam 306 defines a substrate plane that lies parallel to the X-Y plane of the Cartesian coordinate system shown. Accordingly, when the rotatable extraction electrode 120 is rotated to scan an ion beam across the substrate 124, the angle of incidence of the ion beam 306 with respect to the surface of the substrate 124 may vary. The angle of incidence of the ion beam may be defined as an average angle of incidence (with respect to the substrate 124) for all ion trajectories within the ion beam 306, in which ions may be distributed over a range of angles as discussed in more detail below. This average angle of incidence may vary in such a manner that portions of the substrate 124 that lie toward the edges are exposed to ions whose angle of incidence varies by several degrees or more with respect to those portions near the middle of the substrate 124. Accordingly, the processing system 150 may best be employed to process substrates with ion beams for applications in which the substrate or substrate layer being processed is not sensitive to the direction or angle of incidence of the ions, or in applications of ion processing where variations in average angle of incidence of ions across a substrate are tolerable.

Figure 6:
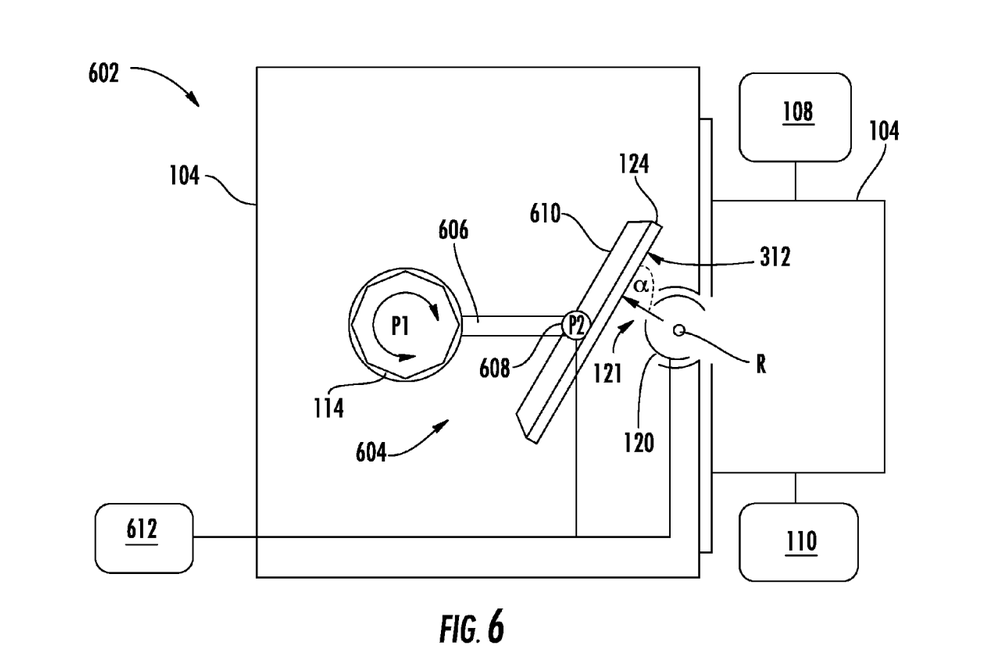
FIG. 6 is a schematic depiction of another exemplary processing system consistent with the present embodiments.

However, in other embodiments, a substrate stage is provided that has the capability of substrate tilt (rotational) motion. This allows the angle of the substrate surface to vary in a manner that may maintain a constant angle of incidence of an ion beam as the rotatable extraction electrode rotates. FIG. 6 depicts and embodiment of a processing system 602 that includes a substrate stage 604 in which a substrate platen 610 is provided with tilt capability. As with the rotatable substrate stage 112, the substrate stage 604 is rotatable about the axis P1. In particular, rotation of the rotation member 114 generates rotation of radial member 606 about the axis P1. For example, a 90 degree rotation of radial member 606, which is affixed to substrate platen 610, may transport the substrate platen 610 from a load position (not shown, but see FIG. 2A) and a process position shown in FIG. 6.

As further illustrated in FIG. 6, a pivot 608 is provided that is attached to the substrate platen 610. The pivot 608 facilitates rotation or tilting of the substrate platen 610 about a pivot axis P2 that is parallel to the extraction electrode axis R. In this manner, the substrate platen 610 may rotate in concert with rotation of the rotatable extraction electrode 120. In the embodiment of FIG. 6, a rotation synchronizer 612 is provided to generate signals to synchronize rotation of the rotatable extraction electrode 120 and substrate platen 610. In particular, synchronizing signals may be sent to separate drives or controllers (not shown) that control the rotation rotatable extraction electrode 120 and substrate platen 610. This serves to generate rotation of the rotatable extraction electrode 120 that is coupled to rotation of substrate platen 610 in a controlled manner. The coupled rotation of rotatable extraction electrode 120 and substrate platen 610 may be such that the angle α formed by ions (represented by the arrow) that are extracted from the aperture 121 with respect to substrate surface 312 remains constant during the coupled rotation.

Figure 7A:
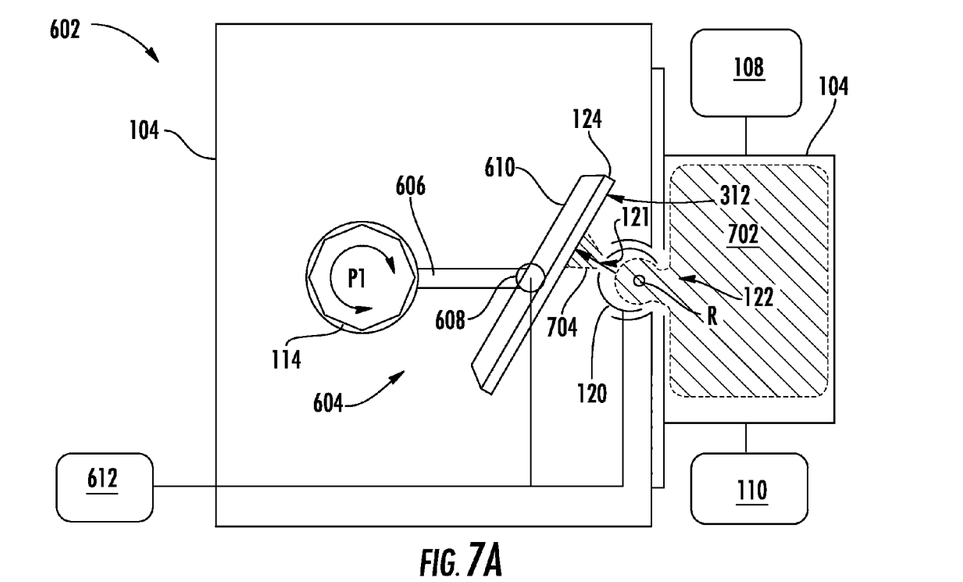
FIG. 7A depicts one instance of operation of the processing system of FIG. 6.
Figure 7B:
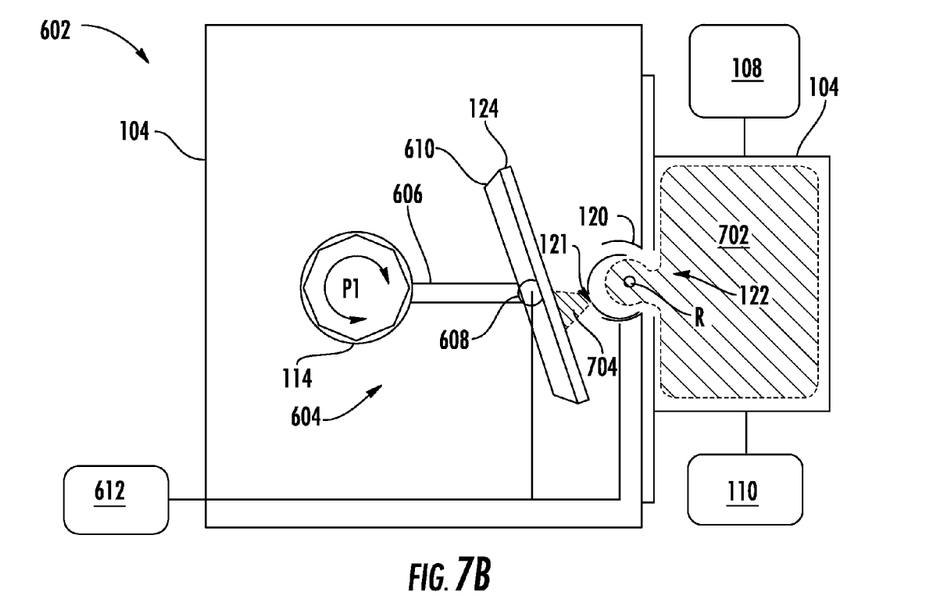
FIG. 7B depicts another instance of operation of the processing system of FIG. 6.

FIGS. 7A and 7B together depict one scenario for scanning of an ion beam across a substrate using coupled rotation of the rotatable extraction electrode 120 and substrate platen 610. In particular, FIG. 7A depicts one instance of operation of the processing system 602. A plasma 702 is generated in the plasma chamber 104, and a bias applied by the bias source 110 to the plasma chamber 104. This causes an ion beam 704 to be extracted from the rotatable extraction electrode 120 and delivered to the substrate 124. To scan the ion beam 704 across the entire substrate 124, the rotatable extraction electrode may be rotated from an extreme clockwise position (for example, ~11:30 o'clock for aperture 121) in which ions are directed to a first end of the substrate 124 to an extreme counterclockwise position (for example, ~6:30 o'clock for aperture 121) in which ions are directed to a second end of substrate 124. In the instance shown in FIG. 7A, the aperture 121 of rotatable extraction electrode 120 is located at a first rotational position or angle that directs the ion beam 704 upwardly and to the left in the figure. At the same time the substrate platen 610 is oriented at a first substrate tilt or angle in which the substrate surface 312 faces downwardly and to the right in the figure. In the example shown, the ion beam 704 may form an angle of incidence of ninety degrees with respect to the substrate surface 312 of substrate 124.

FIG. 7B depicts a second instance of operation of the processing system 602. The plasma 702 generated in the plasma chamber 104 and used to extract ion beam 704 in the scenario of FIG. 7A is still ignited, such that ion beam 704 continues to be extracted from the rotatable extraction electrode 120 and delivered to the substrate 124. In the instance shown in FIG. 7B, the aperture 121 of rotatable extraction electrode 120 is located at a second rotational position or angle that directs the ion beam 704 downwardly and to the left in the figure. At the same time the substrate platen 610 is oriented at a second substrate tilt or angle in which the substrate surface 312 faces upwardly and to the right in the figure. In the example shown, the ion beam 704 may also form an angle of incidence of ninety degrees with respect to the substrate surface 312 of substrate 124. Thus, the ion beam 704 may be scanned across the substrate 124 at a constant angle with respect to the substrate surface 312 without translational movement of the substrate 124. In various additional embodiments the coupled rotation of the substrate platen 610 and rotatable extraction electrode 120 may constitute an oscillation such that an ion beam is scanned back and forth across the substrate 124.

In various additional embodiments a rotatable extraction electrode may be coupled to a cam (not shown). In some embodiments the cam may be so designed as to impart a motion to the extraction aperture of a rotatable extraction electrode that maintains during rotation a constant closest distance between the extraction aperture and a substrate being processed. This may be used, for example, in systems having a rotatable substrate platen as illustrated in FIGS. 7A and 7B. In this manner, an ion beam may be scanned across a substrate at a constant angle of incidence with respect to the substrate and at a constant distance between extraction aperture and substrate.

In various applications of ion processing of a substrate it may be useful or desirable to provide ions to a substrate over a range of angles. For example, this may be useful for treating patterned features that present surfaces at different angles with respect to a given direction. It is to be noted that in variants of the embodiments depicted in FIGS. 2A to 7B, ions may be extracted from a rotatable extraction electrode over a range of angles. For a given set of experimental conditions, the range of angles may be fixed and may span a range of twenty degrees, thirty degrees, sixty degrees, ninety degrees, or one hundred twenty degrees in some instances. The embodiments are not limited in this context. Thus, in the example of FIGS. 3 and 4 ions may impinge on the substrate 124 over a range of angles as the ion beam 306 is scanned across the substrate 124, although the average angle of the ions may vary with respect to a perpendicular 125 to the substrate 124. Notably, the average angle of the ion beam 306, which may represent the angle formed by an ion trajectory in the center of ion beam 306, may vary from a positive angle with respect to the perpendicular 125 in FIG. 3 to a negative angle in FIG. 4.

Figure 8A:
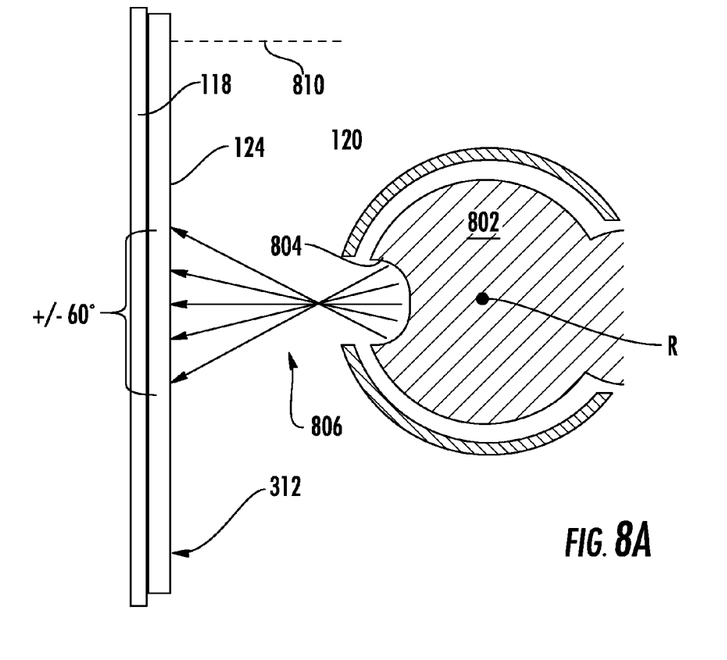
FIG. 8A depicts details of ion beam geometry at a first instance using a rotatable extraction electrode of the present embodiments.
Figure 8B:
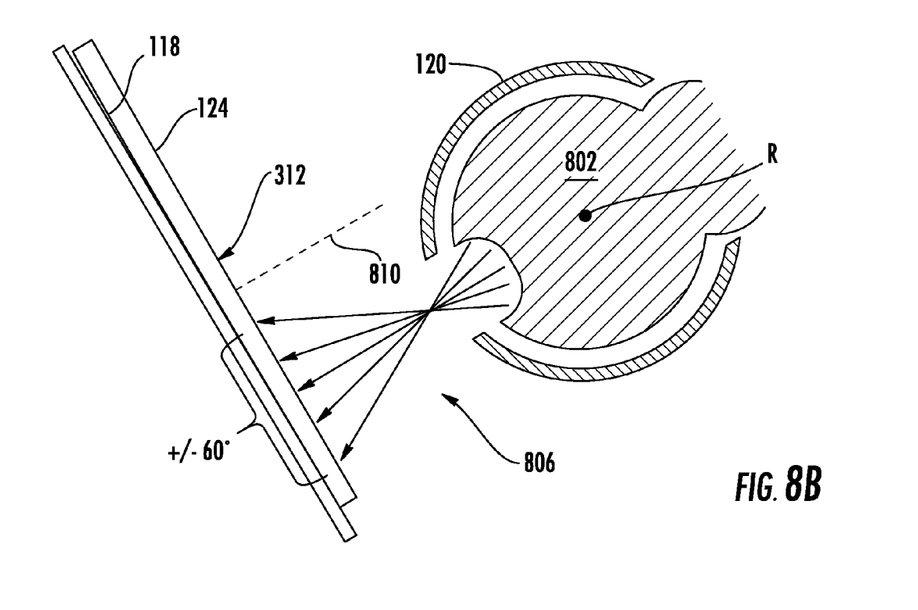
FIG. 8B depicts details of ion beam geometry at a second instance using the rotatable extraction electrode of FIG. 8A.

Consistent with the various additional embodiments, the coupled rotation of a rotatable extraction electrode and a substrate platen provides an apparatus for scanning a substrate with an ion beam in which the range of angles with respect to the substrate surface is constant. FIGS. 8A and 8B depict one scenario for processing a substrate 124 using the rotatable extraction electrode 120. As shown in FIG. 8A, experimental conditions within a processing system may be generated such that a plasma 802 has a sheath boundary portion 804 that has the concave curvature as shown. This results in extraction of ions 806 over a range of angles which impinge upon the substrate surface 312 at angles that may span an angular range up to 120 degrees in some cases, although the angular range may be ninety degrees, sixty degrees or forty degrees, to cite a few instances. The embodiments are not limited in this context. In one example, this range may cover an angular range between −60 and +60 degrees with respect to a normal 810 to the substrate surface 312.

In the instance depicted in FIG. 8B, the rotatable extraction electrode and substrate platen 118 have undergone coupled rotation with respect to the scenario of FIG. 8A. In this manner, the ions 806 impinge upon the substrate surface over the same range of angles, such as between −60 and +60 degrees with respect to a normal 810 to the substrate surface 312, as shown in FIG. 8A. In this manner, each portion of the substrate 124 is processed consistently by a collection of ions having the same distribution of angles of incidence.

Figure 9A:
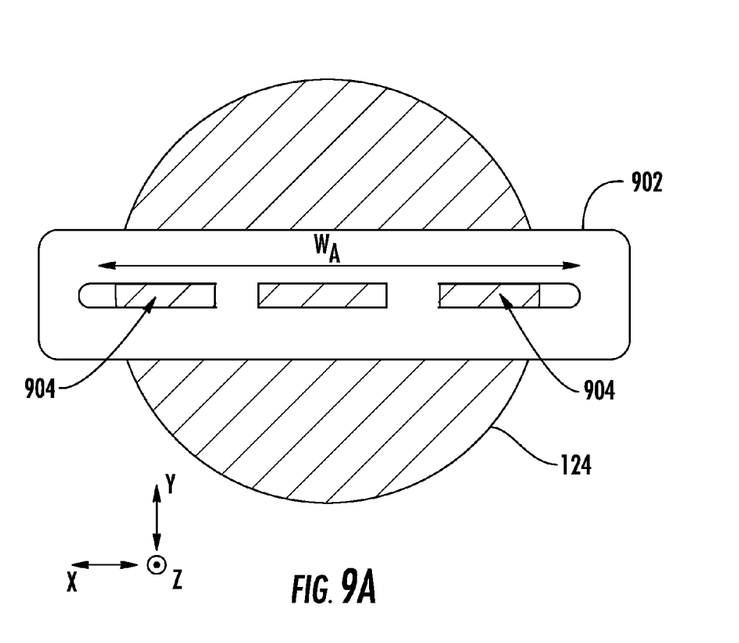
FIGS. 9A and 9B present details of geometry of scanning an ion beam over a substrate using a rotatable extraction aperture according to additional embodiments.
Figure 9B:
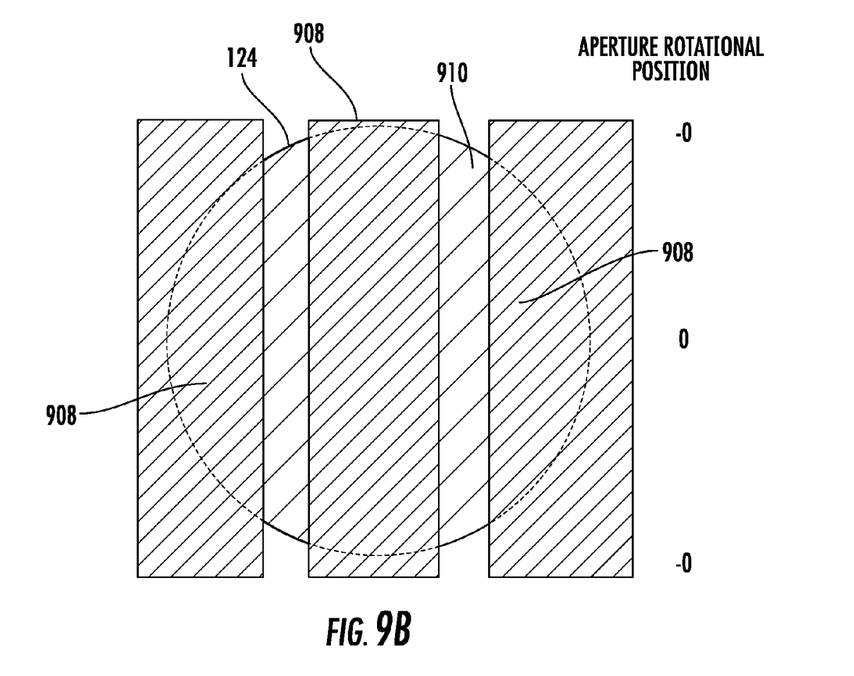

In additional embodiments, a rotatable extraction electrode may include multiple apertures as noted above. FIG. 9A presents one example of a rotatable extraction electrode 902 having three segmented apertures 904 arrange along a line. FIG. 9B presents an example of ion implantation processing the substrate 124 after the rotatable extraction electrode 902 is rotated through the angular range −θ to +θ while ions are extracted through the segmented apertures 904. As illustrated, the implanted regions 908 create a striped pattern of implantation on the substrate 124 in which unimplanted regions 910 separate implanted regions 908.

Figure 10:
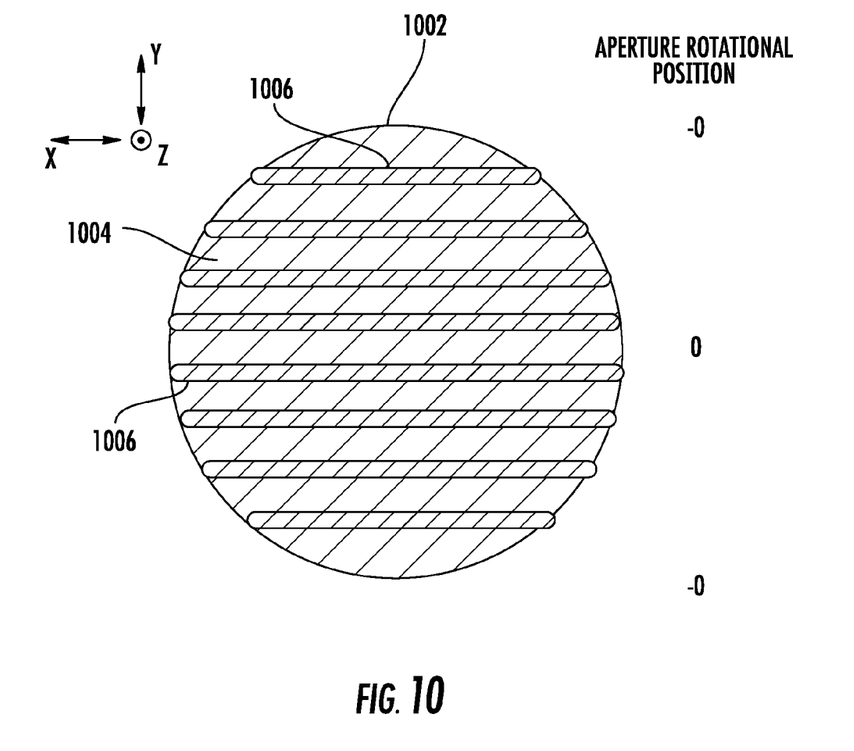
FIG. 10 present details of geometry of a patterned substrate exposed to pulsed ions using a rotatable extraction aperture according to various embodiments.

In additional embodiments, scanning is performed using a rotatable extraction electrode while ions are directed in pulses to a substrate. The pulsing of ions may be set to create regions in a substrate which are untreated by ions that are interspersed with regions that are impacted by ions. During "on" portions of a pulse an ion beam is extracted and impinges on the substrate and during "off" portions of the pulse the ion beam does not impinge on the substrate. Pulsing may be performed, for example, by pulsing a plasma on and off in a plasma chamber. Alternatively, pulsing may be performed by applying a bias between substrate and plasma chamber as a series of pulses in which during "on" portions of a pulse, the ions are accelerated to the substrate with ion energy defined by the applied bias, and in which during "off" portions of the pulse, no bias is applied between substrate and plasma chamber. Returning to FIG. 1, in different embodiments either the bias source 110 and/or power source 108 may be configured as pulsed sources. Using an elongated aperture whose long axis is oriented perpendicularly to the scan direction (see FIG. 5A), such pulsing of ions may create, for example, lines or stripes of implanted dopants at select positions on the surface of substrate, such as a solar cell. The pulse duration coupled with the rotational speed of the rotating extraction electrode may be tailored to produce the desired width of a processed (implanted) region. In some embodiments, pulsing may take place at kiloHertz or greater frequency. FIG. 10 presents one example of a patterned substrate 1002 created by pulsing ions while a rotatable extraction electrode rotates between the angular range shown. A result is the generation of implanted stripes 1004 on the patterned substrate 1002 that are interspersed with unimplanted regions 1006.

Although the embodiments depicted in the figures illustrate apparatus in which the extraction aperture axis is disposed within the process chamber, in other embodiments the extraction aperture axis may lie along the boundary between a process chamber and plasma chamber. Moreover, in additional embodiments the extraction aperture axis may lie within the plasma chamber.

Additionally, although the figures illustrate embodiments in which a substrate platen and substrate are (predominantly) disposed in a vertical orientation, in other embodiments, the substrate platen and substrate may be oriented facing downwardly or oriented facing upwardly. In these embodiments the plasma chamber may be disposed on the bottom or top of the process chamber 106.

The present subject matter is not to be limited in scope by the specific embodiments described herein. Indeed, other various embodiments of and modifications to the present disclosure, in addition to those described herein, will be apparent to those of ordinary skill in the art from the foregoing description and accompanying drawings.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A system for processing a substrate comprising:
    a plasma chamber to generate a plasma therein;
    a process chamber to house the substrate, the process chamber adjacent the plasma chamber; and
    a rotatable extraction electrode disposed between the plasma chamber and substrate, the rotatable extraction electrode configured to extract an ion beam from the plasma, and configured to scan the ion beam over the substrate without movement of the substrate by rotation about an extraction electrode axis, wherein the rotatable extraction electrode comprises an elongated extraction aperture having a width along a first direction parallel to the rotation axis and a height along a second direction perpendicular to the first direction, the width being larger than the height.

2. The system of claim 1, wherein the process chamber has a chamber wall defining a chamber wall surface adjacent the plasma chamber, the extraction electrode axis being parallel to the chamber wall surface.

3. The system of claim 1, wherein the rotatable extraction electrode comprises a cylinder structure.

4. The system of claim 1 further comprising a rotatable substrate stage comprising:
    a substrate platen to support the substrate on a first surface;
    a radial portion connected to the platen on a second surface;
    and a rotation member connected to the radial portion, wherein the rotatable substrate stage is configured to move the substrate from a load position to a process position via rotation of the rotation member.

5. The system of claim 1, further comprising a substrate platen, a pivot connected to the substrate platen and having a pivot axis parallel to the extraction electrode axis, and a drive coupled to the pivot, the drive configured to generate a tilt of the substrate about the pivot axis.

6. The system of claim 5, further comprising a rotation synchronizer configured to generate signals to synchronize the tilt of the substrate with rotation of the rotatable extraction electrode, wherein the rotatable extraction electrode is configured during rotation about the extraction electrode axis to scan the ion beam over the substrate without changing an angle of incidence of the ion beam with respect to a surface of the substrate.

7. The system of claim 6, wherein the ion beam comprises ions having trajectories distributed over a range of angles of incidence with respect to a surface of the substrate, wherein the range of angles of incidence with respect to the surface of the substrate does not vary during the rotation about the extraction electrode axis.

8. The system of claim 5, wherein the rotatable extraction electrode comprising an elongated extraction aperture having a long direction parallel to the extraction electrode axis, the system further comprising a cam configured to rotate on the extraction electrode axis and coupled to the rotatable extraction electrode, wherein a closest distance between the extraction aperture and substrate is constant during rotation about the extraction electrode axis.

9. The system of claim 1, wherein the rotatable extraction electrode comprises a plurality of apertures.

10. The system of claim 1, wherein the rotatable extraction electrode comprises at least one additional elongated extraction aperture.

11. The system of claim 10, wherein the rotatable extraction electrode comprises a plurality of elongated extraction apertures spaced along the first direction.

12. The system of claim 10, wherein the rotatable extraction electrode comprises a plurality of elongated extraction apertures spaced along the second direction.

* * * * *